United States Patent
Lee et al.

(10) Patent No.: US 7,207,691 B2
(45) Date of Patent: Apr. 24, 2007

(54) LIGHT EMITTING DEVICE

(76) Inventors: Kun-Chui Lee, P.O. Box No. 6-57, Junghe, Taipei 235 (TW); Tzu-Chi Cheng, P.O. Box No. 6-57, Junghe, Taipei 235 (TW); Jung-Pin Cheng, 4F., No. 2, Changtai St., Wanhua District, Taipei City 108 (TW)

( * ) Notice: Subject to any disclaimer, the term of this patent is extended or adjusted under 35 U.S.C. 154(b) by 0 days.

(21) Appl. No.: 10/860,151

(22) Filed: Jun. 4, 2004

(65) Prior Publication Data

US 2005/0117334 A1 Jun. 2, 2005

(30) Foreign Application Priority Data

Nov. 27, 2003 (TW) ............................... 92133421 A

(51) Int. Cl.
*F21V 9/00* (2006.01)
(52) U.S. Cl. .................... 362/231; 362/84; 362/230; 362/800
(58) Field of Classification Search ............... 362/84, 362/230–231, 242, 244, 246, 800
See application file for complete search history.

(56) References Cited

U.S. PATENT DOCUMENTS

| | | | |
|---|---|---|---|
| 4,882,617 A | * | 11/1989 | Vriens .......................... 348/779 |
| 5,143,433 A | * | 9/1992 | Farrell ........................... 362/29 |
| 6,357,889 B1 | * | 3/2002 | Duggal et al. ................. 362/84 |
| 6,540,377 B1 | * | 4/2003 | Ota et al. ..................... 362/231 |
| 6,817,735 B2 | * | 11/2004 | Shimizu et al. .............. 362/231 |
| 2005/0099786 A1 | * | 5/2005 | Liu et al. ....................... 362/20 |
| 2005/0099808 A1 | * | 5/2005 | Cheng et al. ................ 362/231 |

FOREIGN PATENT DOCUMENTS

JP 2003-249693 * 9/2003

* cited by examiner

*Primary Examiner*—Thomas M. Sember
*Assistant Examiner*—Adam C. Rehm
(74) *Attorney, Agent, or Firm*—Troxell Law Office, PLLC

(57) ABSTRACT

A light emitting device including three light emitting sources and a phosphor, with the three light sources consisted of following light emitting diodes (LED) emitting lights having different wavelengths. Wherein, two light sources are used to excite the phosphor to produce a distinct wavelength different from those of the two light sources. The distinct wavelength is blended with portions of the two light sources and a light source from another independent light source, and a blended light is released to obtain a white light.

1 Claim, 9 Drawing Sheets

LIGHT EMITTING DEVICE

BACKGROUND OF THE INVENTION (a) Field of the Invention

The invention relates to a light emitting device, and more particularly, to a light emitting device comprising three light emitting diodes (LED) and a phosphor. The phosphor is excited by absorbing lights from first and second light sources to emit a distinct light. The distinct light is blended with a red light from the third light source and unexcited blue lights from the first and second light sources, and a blended light is released to obtain a white light.

(b) Description of the Prior Art

With reference to FIG. 8 showing a curve diagram of natural sunlight (natural white light), a light wavelength of the light therein ranges between 360 and 750 nm.

To manufacture a white light emitting device having a wavelength approaching that of natural sunlight (white light), the Taiwan Patent Publication No. 383508 discloses a light emitting device and a display device, in that a blue light emitting diode serves as a blue light source for exciting a phosphor, such that the excited phosphor emits a light having a wavelength different from that of the blue light. A white light is obtained when the different light is blended with the unexcited blue light emitted by the light source. Referring to FIG. 9, a curve S2 showing a spectrum of the white light obtained is compared with a curve of the natural white light (sunlight) in FIG. 8, and it is observed that a rather large deviation exists between the two curves. A reason behind is that, the "white light" defined by blending the light having a larger wavelength emitted by the phosphor excited by the blue light with the unexcited blue light, when compared with natural sunlight, has unsatisfactory color rendering effects.

Therefore, it is a vital task of the invention as how to provide a white light approaching natural sunlight.

SUMMARY OF THE INVENTION

The object of the invention is to provide a light emitting device that utilizes two light sources for exciting a phosphor to produce light wavelengths different from those emitted by the two light sources. The two different light wavelengths are blended with portions of the two light sources and a light from another independent light source, and a blended light is released to obtain a white light.

Referring to FIGS. 1 and 5, a light emitting device 10 according to the invention comprises:

three light emitting sources and a phosphor 50, with the three light sources being consisted by following light emitting diodes (LED) having different wavelengths; wherein:

a first light source A is formed by at least one first LED 20 capable of emitting a blue light having a wavelength ranging between 360 nm and 480 nm; a second light source B is formed by at least one second LED 30 capable of emitted a blue to green light having a wavelength ranging between 480 nm and 570 nm;

a third light source R formed is by at least one third LED 40 capable of emitting a red light having a wavelength ranging between 585 nm and 780 nm.

The phosphor 50 is selected from at least one of the following materials:

(a) $S_{im}O^{4-}{}_n$; and
(b) $BxOy^{3-}$.

The phosphor 50 is for absorbing lights having different wavelengths and emitted by the first and second light sources A and B, and is excited to emit a light 60 having a wavelength distinct from those of the first and second light sources A and B; wherein, the distinct light 60 is blended with the red light emitted from the third light source R and the lights emitted from the first and second light sources A and B, and a blended light is released to obtain a white light W.

The distinct light 60 has a wavelength ranging between 500 nm and 585 nm.

DETAILED DESCRIPTION OF THE PREFERRED EMBODIMENTS

Figure 1:
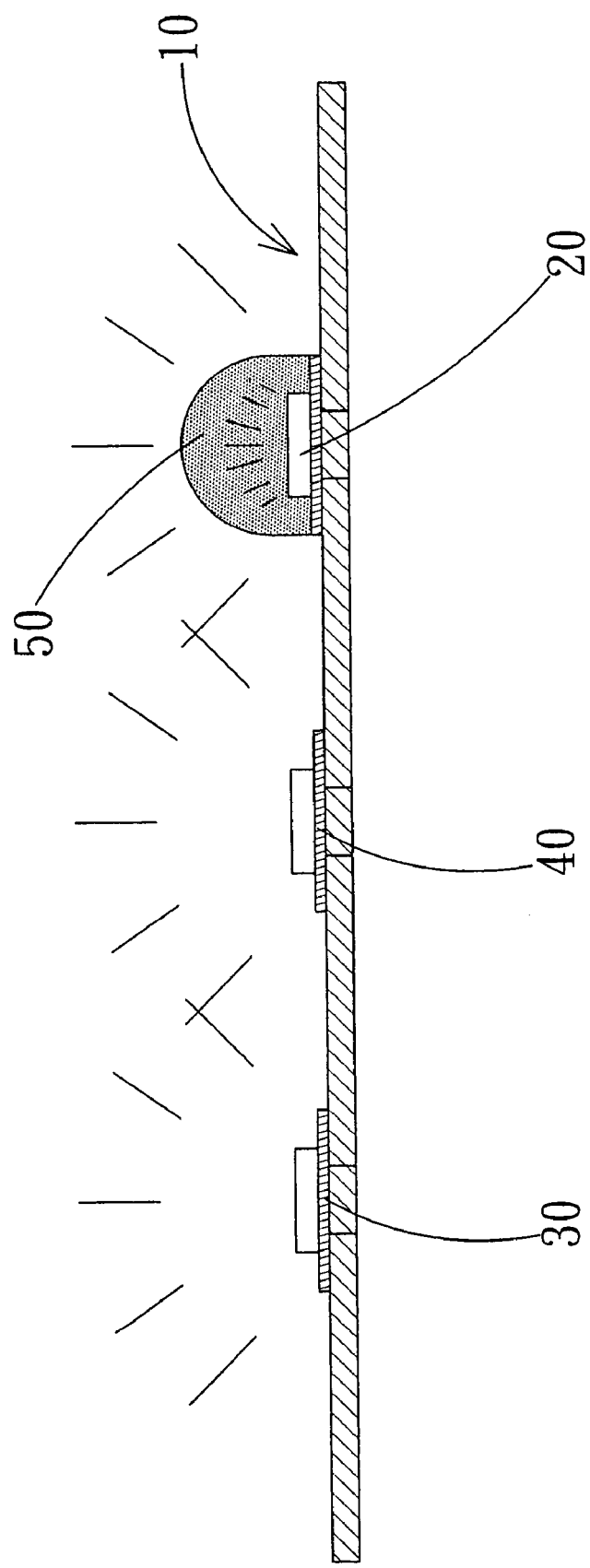
FIG. 1 shows a schematic view of a device consisted of three light emitting diodes (LED) and a phosphor according to the invention.
Figure 5:
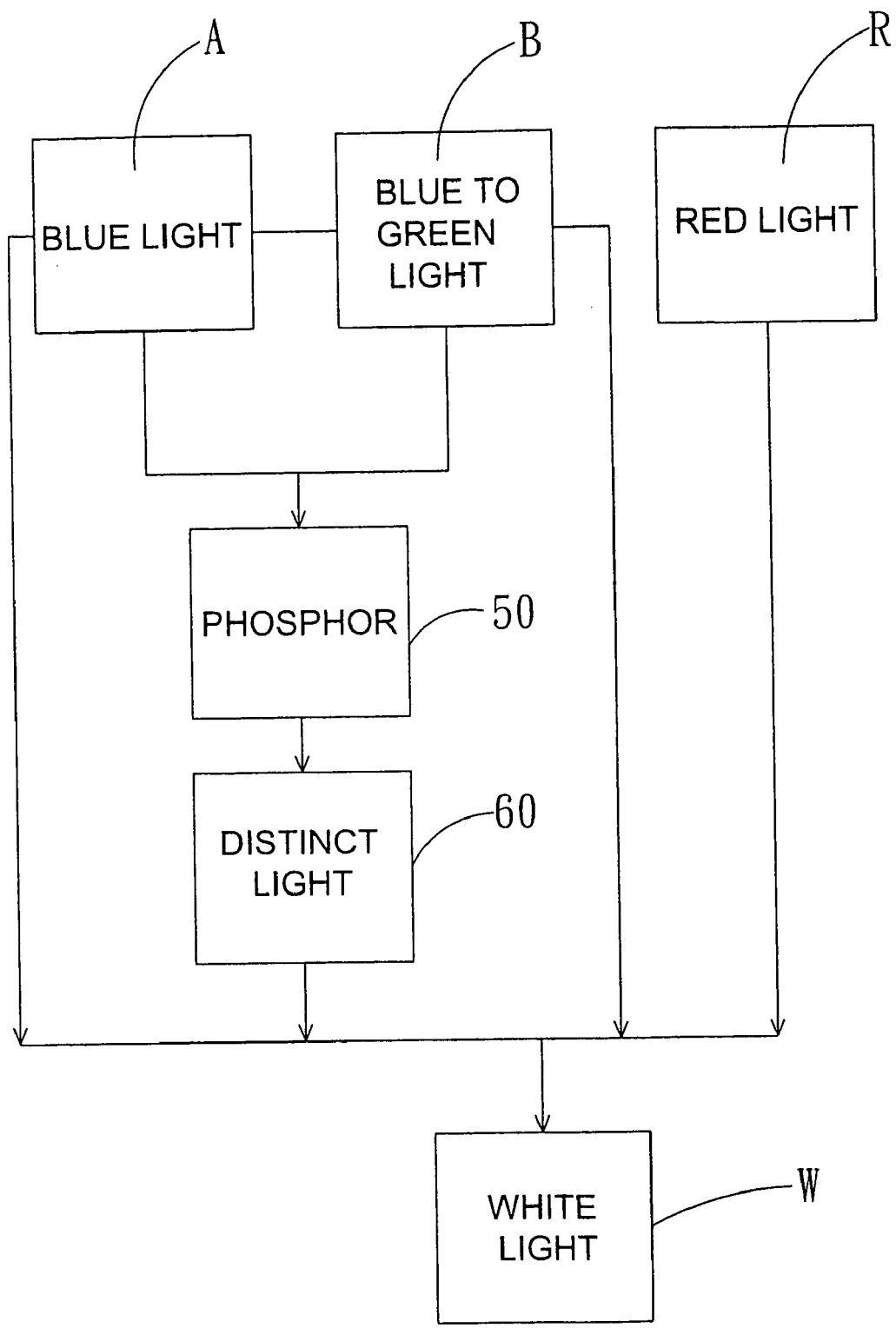
FIG. 5 shows a block diagram illustrating formation of a white light according to the invention.
Figure 6:
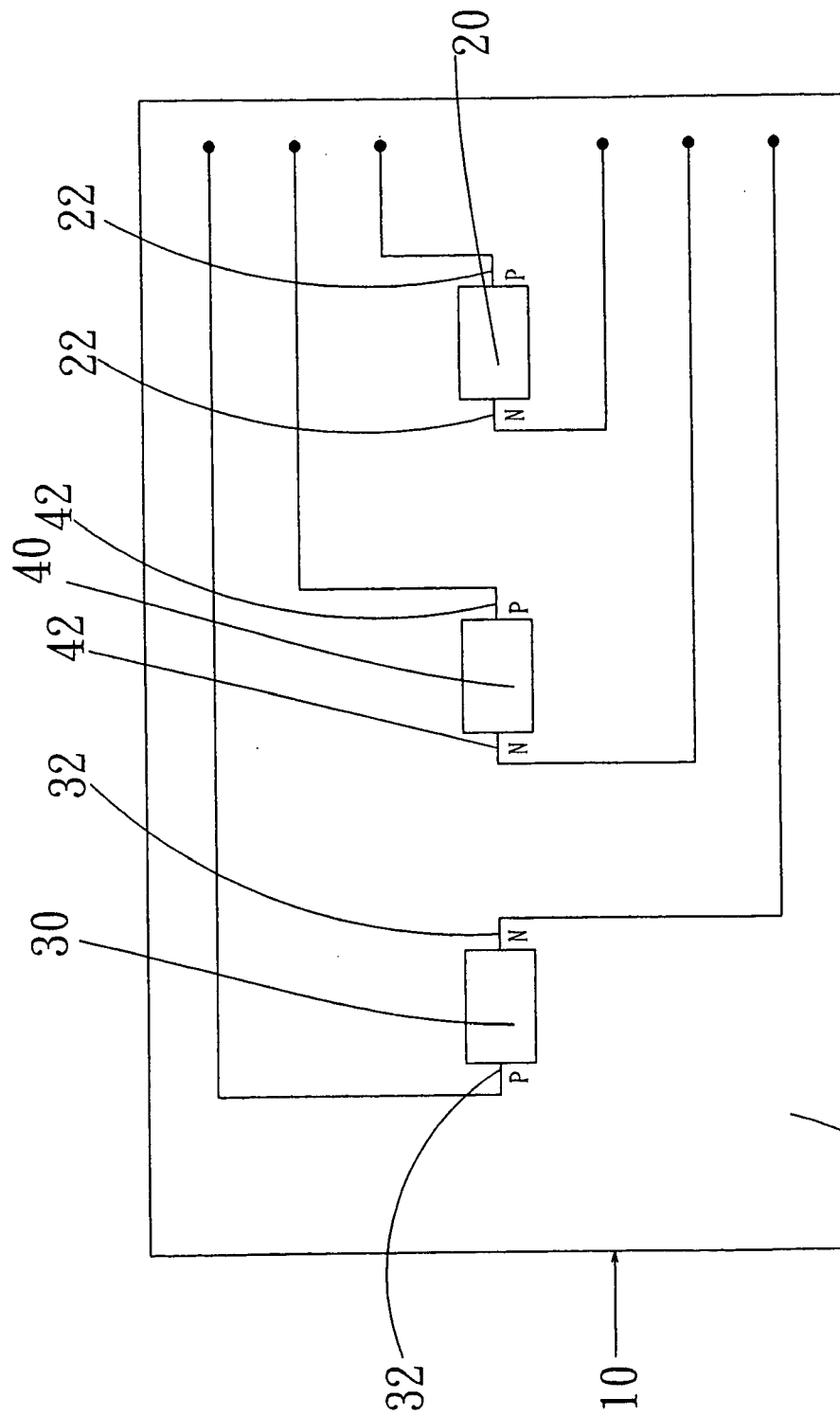
FIG. 6 shows a planar schematic view illustrating a device installed at a PCB according to the invention.

Referring to FIGS. 1 and 6, a device may include a PCB 80 or other modularized base. Conducting pins 22, 32 and 42 of the first LED 20, the second LED 30 and the third LED 40 are soldered to the device 10 to form an electric loop. The third LED 40 is located between the first and second LEDs 20 and 30. The phosphor 50s if formed by mixing transparent resin and phosphor powder, and is encapsulated around the first LED 20. When being triggered by an electrode, the first LED 20 emits a blue light having a wavelength ranging between 360 nm and 480nm for serving as a first light source A. When being triggered by an electrode, the second LED 30 emits a blue to green light defined by naked eye and having a wavelength ranging between 480 nm and 570 nm for serving as a second light source B. When being triggered by an electrode, the third LED 40 emits a red light having a wavelength ranging between 558 nm and 780 nm for serving as a third light source R. Referring to FIG. 5, the phosphor 50 is for accepting the blue light serving as the first light source A, which is emitted from an interior to an exterior of the phosphor 50 and absorbed by the phosphor 50. The second light source B emits a blue to green light, and a portion thereof is penetrated into the phosphor 50 from an exterior. Hence, the first and second light sources A and B are simultaneously acted upon the phosphor 50, such that the phosphor 50 absorbs wavelengths of the first and second light sources A and B at the same time, thereby becoming excited to emit a distinct light 60 having a wavelength ranging between 500 nm and 585 nm. The distinct light 60 is blended with lights from the first light source A, the second light source B and the third light source R, with a blended light released to obtain a white light having an excellent color rendering index.

Figure 2:
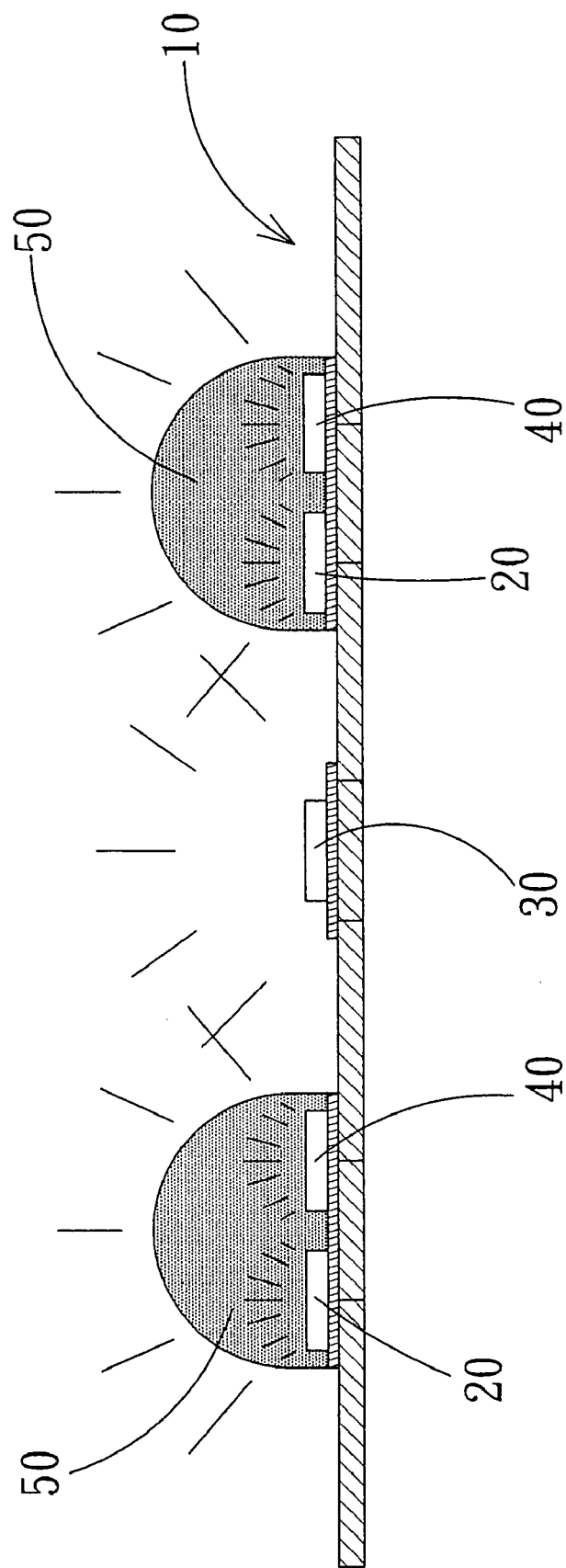
FIG. 2 shows a schematic view of a device consisted of three LEDs and two phosphors according to the invention.

Referring to FIG. 2 showing another embodiment according to the invention, the first LED 20 and the third LED 40 located at two sides are both encapsulated by the phosphors 50. Thus, the device 10 has each of left and right sides thereof provided with a phosphor 50 (50), and a second LED 30 disposed at a center section thereof. For that the third light source R emits a red light having a wavelength ranging between 585 nm and 780 nm that is not absorbed by the phosphor 50, the red light, theoretically, is incapable of exciting the phosphor 50. Blue lights having a wavelength ranging between 360 nm and 480 nm from the two first LEDs 20 (20) at the left and right sides are emitted from an interior to an exterior of the phosphors 50 to excite a distinct light 60 having a different wavelength. Meanwhile, the red light from the third light source R is emitted from an interior to an exterior of the phosphors 50, and a wavelength emitted from the second LED 30 ranges between 480 nm and 570 nm (with a color appearing as blue to green). Therefore, the lights from the first, second and third light source A, B and R, and the distinct light 60 are blended above the device 10 to output a light defined as a white by naked eye. For that the white light obtained from the three independent lights from the first, second and third light sources A, B and R, and the distinct light 60 all have different wavelengths, the white light W has an excellent color rendering index.

Figure 7:
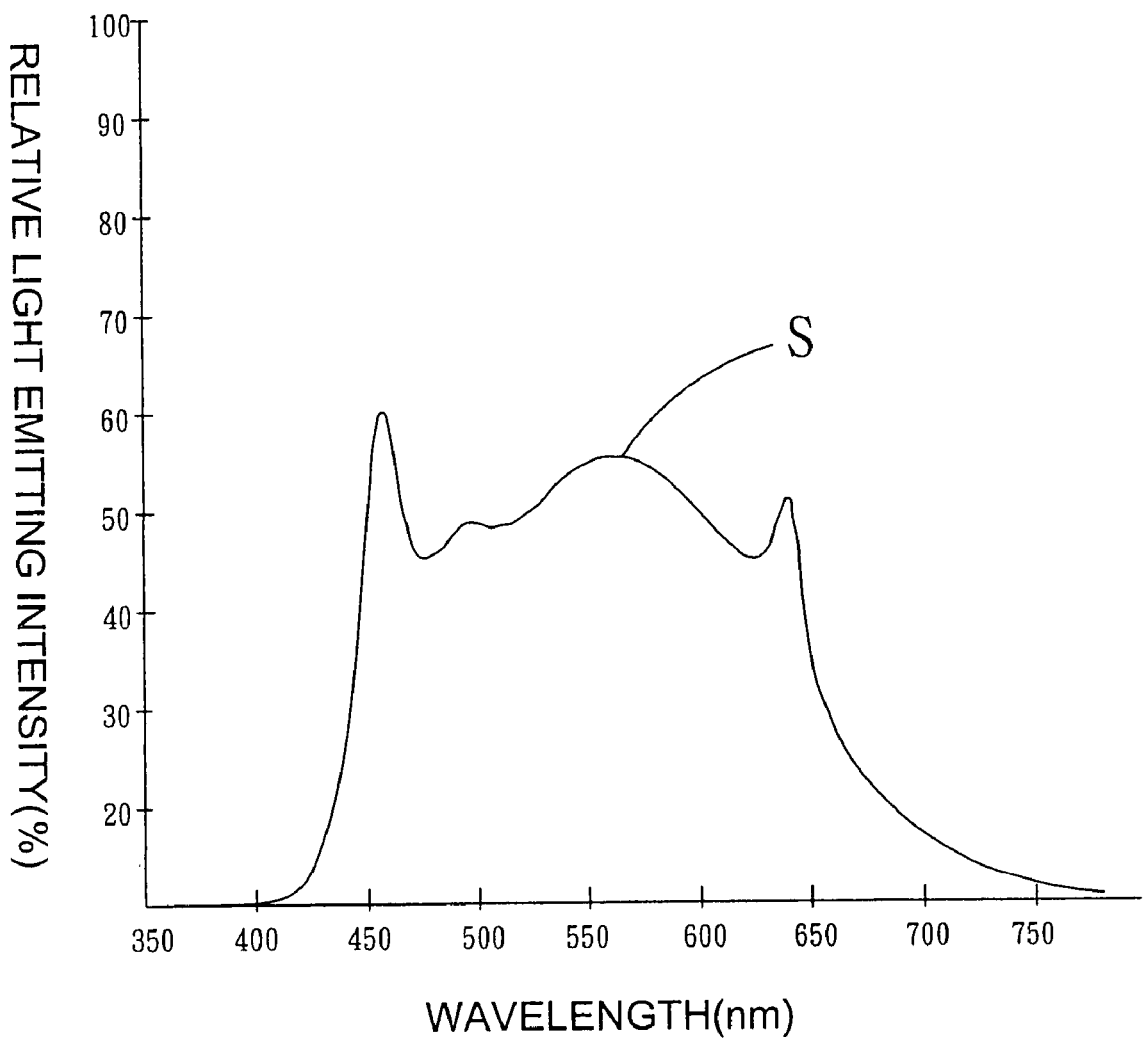
FIG. 7 shows a curve diagram illustrating a spectrum of a white light according to the invention.
Figure 8:
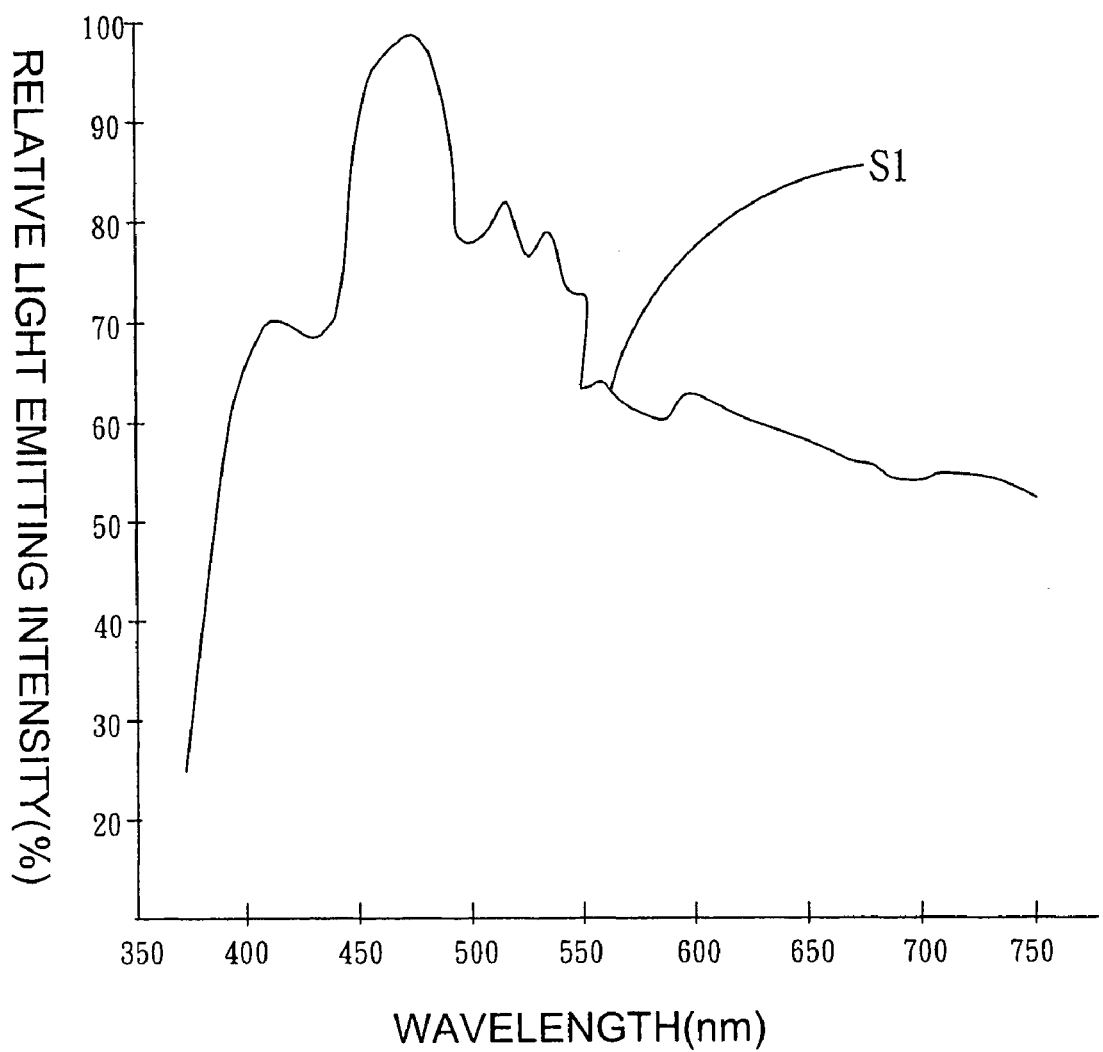
FIG. 8 shows a curve diagram illustrating a spectrum of natural sunlight of a prior invention.
Figure 9:
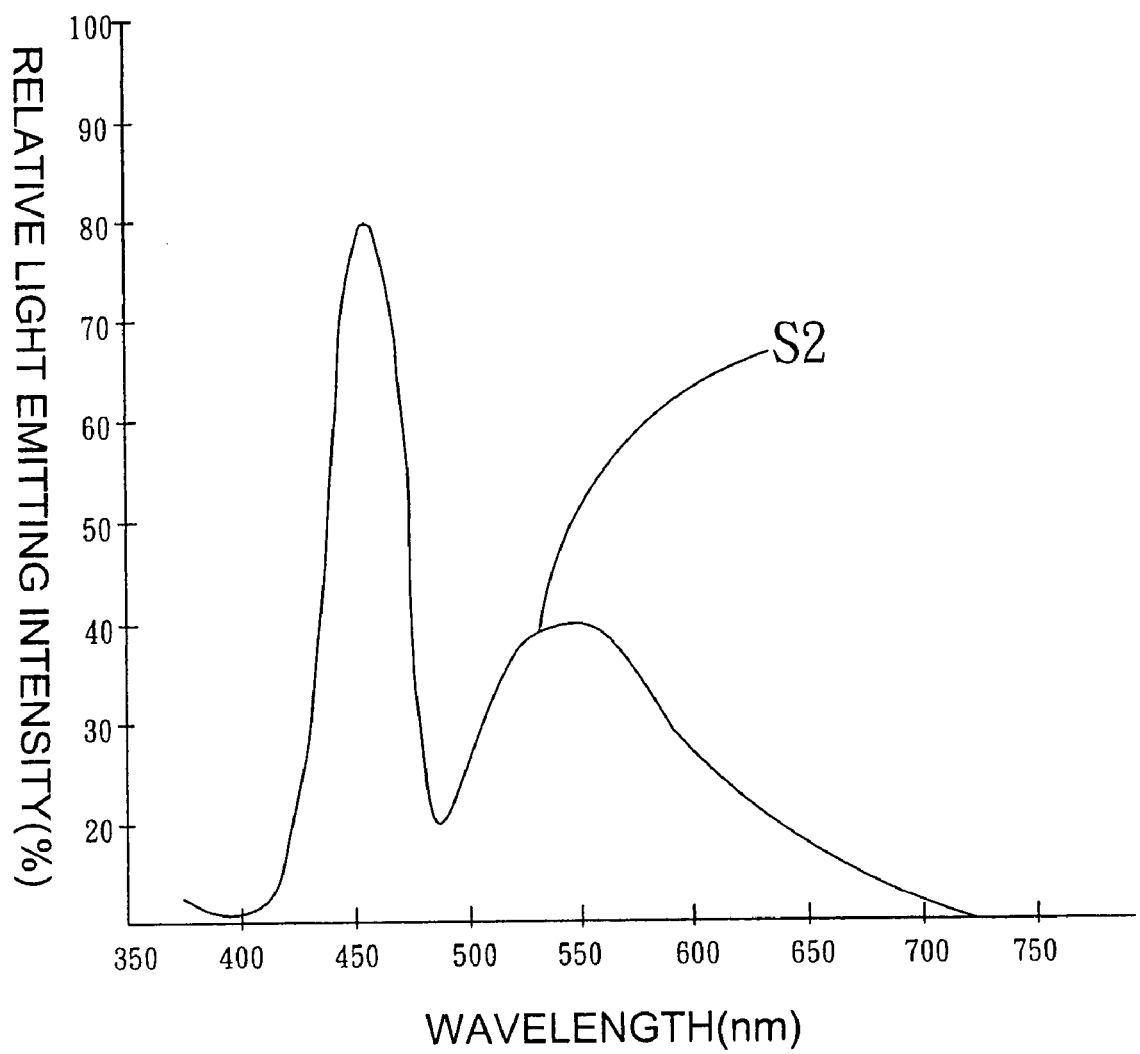
FIG. 9 shows a curve diagram illustrating a spectrum obtained from a phosphor layer excited by a blue light source of a prior invention.

Referring to FIG. 7 showing a curve diagram illustrating experimental white light according to the invention, a curve S obtained is compared with a curve S1 of sunlight shown in FIG. 8, and it is observed that the two curves S and S1 appear rather alike. Therefore, the experimental white light has a color rendering index (CRI) as high as over 90%.

Figure 3:
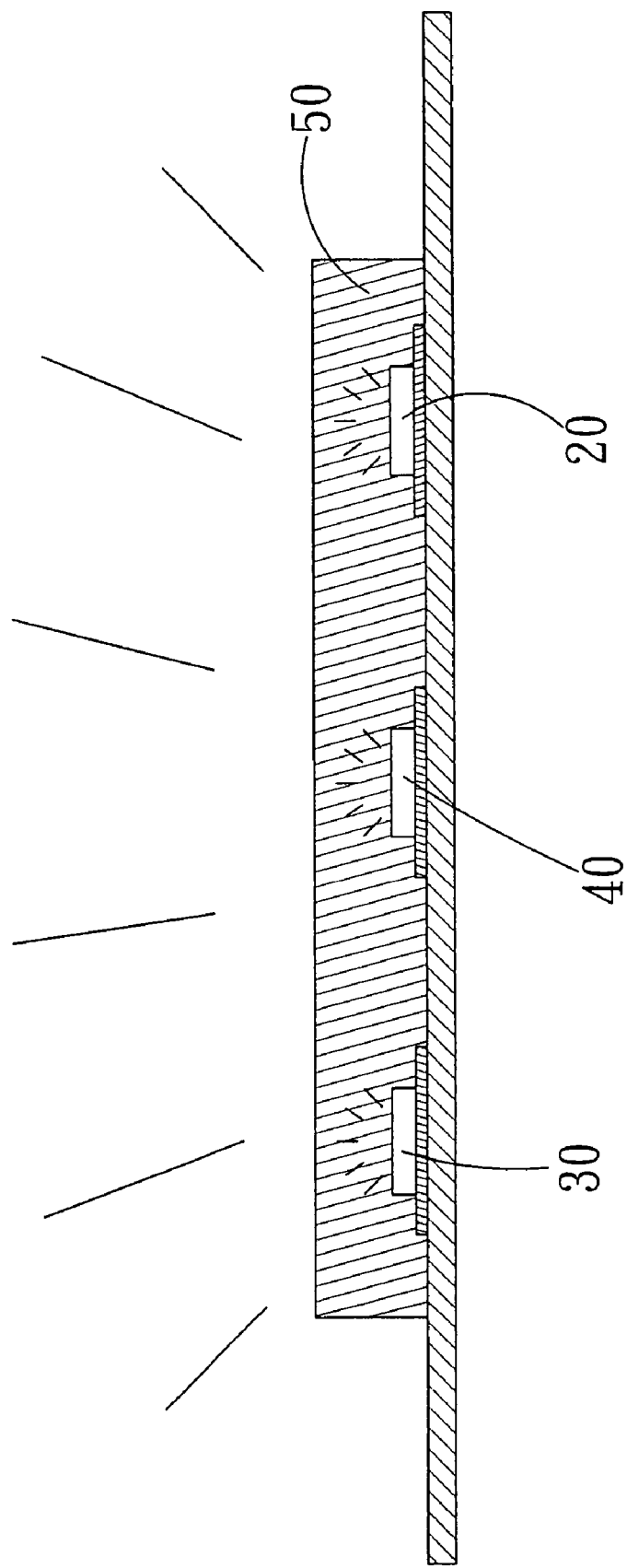
FIG. 3 shows a schematic view of a device consisted of three LEDs encapsulated a phosphor according to the invention.
Figure 4:
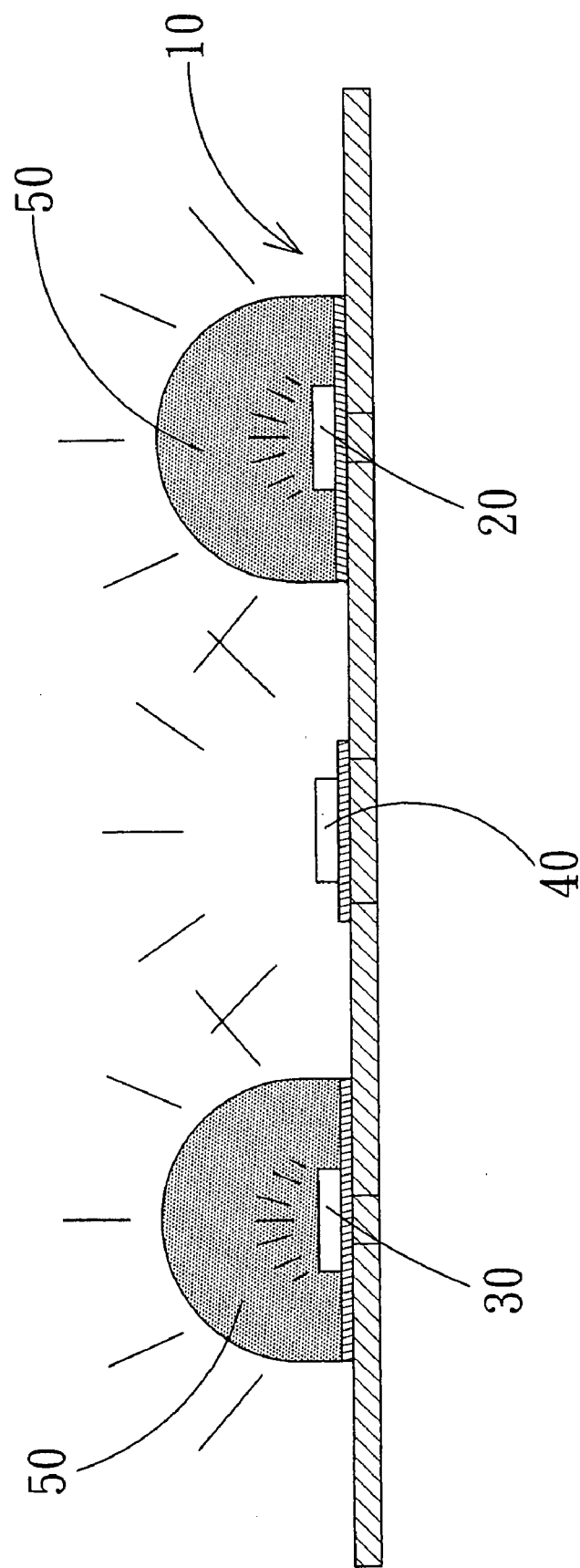
FIG. 4 shows a schematic view of a device consisted of three LEDs and two phosphors according to the invention.

Referring to FIG. 3 showing yet another embodiment according to the invention, the first, second and third LEDs 20, 30 and 40 are all encapsulated by the phosphors 50. Using the first and second light sources A and B, the phosphors 50 are excited to emit a distinct light 60. The distinct light 60 is blended with portions of wavelengths of the first and second light sources A and B, and the wavelength of the third light source R, with a white light W displayed above the device 10.

Referring to FIG. 3 showing still another embodiment according to the invention, the device 10 is soldered with first and second LEDs 20 and 30 at left and right sides thereof, and the third LED 40 joined at a center section thereof. Two phosphors 50 (50) are respectively encapsulated around the first and second LEDs 20 and 30. Similarly, when the first, second and third LEDs 20, 30 and 40 emit the first, second and third light sources A, B and R, the two phosphors 50 (50) are excited to emit a distinct light 60. The distinct light 60 are blended with wavelengths of the first, second and third light sources A, B and R, with a light defined as a white light by naked eye and having an excellent color rendering index obtained.

The phosphor 50 may be made of yttrium alumimium garnet (YAG), $S_{im}O^{4-}{}_{n}$; or $BxOy^3$.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A light emitting device comprising: three light emitting sources and a phosphor, with the three light sources consisting of light emitting diodes (LED) emitting lights having different wavelength; wherein:

a first light source is formed by at least one first LED capable of emitting a blue light having a wavelength ranging between 360 nm and 480 nm;

a second light source is formed by at least one second LED capable of emitted a blue to green light having a wavelength ranging between 480 nm and 570 nm;

a third light source is formed by at least one third LED capable of emitting a red light having a wavelength ranging between 585 nm and 780 nm;

wherein the phosphor is $BxOy^3$;

and a phosphor is for absorbing lights having different wavelengths and emitted by the first and second light sources, and is excited to emit a distinct light having a wavelength distinct from those of the first and second light sources; wherein, the distinct light is blended with the red light emitted from the third light source and the lights emitted from the first and second light sources producing a blended light to obtain a white light;

the distinct light has a wavelength between 500 nm and 585 nm.

* * * * *